United States Patent
Kruchowy et al.

(10) Patent No.: US 6,411,074 B1
(45) Date of Patent: Jun. 25, 2002

(54) PULSE WIDTH MODULATED CABLE SIGNAL INJECTING APPARATUS

(75) Inventors: Roman Kruchowy, Somis; Ian Stewart, Ventura, both of CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 141 days.

(21) Appl. No.: 09/668,273

(22) Filed: Sep. 25, 2000

(51) Int. Cl.[7] ............................................. G01R 19/00
(52) U.S. Cl. ............................ 324/66; 324/527; 324/67
(58) Field of Search ........................... 324/66, 67, 527, 324/523, 668; 379/22, 25

(56) References Cited

U.S. PATENT DOCUMENTS

| | | | | |
|---|---|---|---|---|
| 4,257,002 A | * | 3/1981 | Helms et al. ................ | 324/66 |
| 4,446,421 A | * | 5/1984 | Berde .......................... | 324/523 |
| 5,565,784 A | * | 10/1996 | DeRenne ..................... | 324/133 |

* cited by examiner

Primary Examiner—N. Le
Assistant Examiner—Vincent Q. Nguyen
(74) Attorney, Agent, or Firm—David Kalmbaugh (57) ABSTRACT

A signal injecting apparatus which includes a microcontroller for generating a 1024 hertz square wave signal which is supplied through a NAND gate to a field effect transistor. When the transistor is switch on a tank circuit comprising a pair of capacitors and the primary of a signal injector coil starts oscillating and will continue to oscillate when the transistor is switch off. The power level for the signal to the cable is determined by an operator based on the operator inputs from depressing a pair of push button switches. The microcontroller, responsive to the operator inputs from the push button switches, outputs a digital word to a digital-to-analog converter that represents the required power level. The analog output signal from the digital-to-analog converter is supplied to a control loop circuit which adjust the power level by enabling and disabling the NAND gate.

20 Claims, 7 Drawing Sheets

PULSE WIDTH MODULATED CABLE SIGNAL INJECTING APPARATUS

BACKGROUND OF THE INVENTION

1. Field of the Invention

The present invention relates generally to electrical signal injecting apparatus for use with an underwater cable. More specifically, the present invention relates to a portable water tight signal injecting apparatus for inducing a 1024 Hz signal into an underwater cable which allows the user to track the signal with a tracking probe tuned to the same frequency.

2. Description of the Prior Art

Underwater cables are needed for communications, transmission of video and audio data and the like. It has become common practice to bury these cables in sand or under the ocean floor to avoid damage. When a cable breaks or is damaged there will be requirement to locate the cable to effect repairs to the cable or replacement of the cable.

Accordingly, there is a need to have an apparatus for locating an underwater cable which is buried in sand or under the ocean floor.

SUMMARY OF THE INVENTION

The present invention overcomes some of the difficulties of the prior art including those mentioned above in that it comprises a relatively simple yet highly effective pulse width modulated cable signal injecting apparatus designed to function in an underwater environment. The signal injecting apparatus induces a 1024 hertz tracking signal into a subsea cable allowing an operator to track the signal with a tracking probe tuned to the same frequency.

A microcontroller generates a continuous 1024 hertz square wave signal which is supplied through a NAND gate to a field effect transistor. When the field effect transistor is switch on a tank circuit comprising a pair of capacitors and the primary of an signal injector coil starts oscillating and will continue to oscillate when the field effect transistor is switch off.

The power level for the signal to the cable is determined by an operator based on the operator inputs from depressing a pair of push button switches, which are the power up/down push button switches. The microcontroller, responsive to the operator inputs from the push button switches, outputs a digital word to a digital-to-analog converter that represents the required power level. The analog output signal from the digital-to-analog converter is supplied to a control loop circuit which adjust the power level by enabling and disabling the NAND gate. When the NAND gate is enabled, the 1024 HZ signal passes through the NAND gate turning on the field effect transistor and thus causing the primary of a signal injector coil to start oscillating. When the signal injecting coil's current level reaches a point at which the voltage at the positive input of a comparator reaches a threshold voltage at the negative input of the comparator, the output of the comparator will switch from a low to a high which in combination with a Flip-Flop disables the NAND gate turning off the field effect transistor.

DETAILED DESCRIPTION OF THE PREFERRED EMBODIMENT

Referring to FIGS. 1A–1F and 2, the pulse width modulated cable signal injecting apparatus, designated generally by the reference numeral 20. Injecting apparatus 20, which is designed to function underwater, induces a 1024 hertz signal into a subsea cable. The 1024 Hz signal can then be tracked with a tracking probe tuned to the same frequency. The maximum injecting current provided injecting apparatus 20 is limited to 100 milliamps into a 50 ohm load.

Injecting apparatus 20 comprises two 12 volt, 24 amp-hr deep discharge, lead-acid batteries 22 and 24 which are used as the power source for apparatus 20. Batteries 22 and 24 are connected to provide 24 volts which is needed to generate the required injection cable current of 100 milliamps for testing an underwater cable for damage or breakage. Batteries 22 and 24 allow signal injecting apparatus to operate at full and half power for 4 hours and 12 hours respectively. Charging of batteries 22 and 24 is accomplished through battery charger jack 26 which is connected to a 24 VDC, 2 amp battery charger (not illustrated).

Switch SW1 is a power ON/OFF switch which controls a relay 28. Relay 28 includes a coil 30 and a normally open contact 32. Closure of switch SW1 energizes coil 30 closing contact 32 which provides 24 VDC to terminal $V_{BAT}$ switched. Injecting apparatus 20 also has a varistor 34 which is parallel to normally open contact 32 of relay 28. Varistor 34, which has a threshold voltage of 31 volts, is used to shunt current and protect relay 28 in the event relay 28 opens, i.e. the power is turned off when the injecting apparatus 20 is in a high power mode of operation. Diode D3 is a clamping diode in parallel with the coil 30 of relay 28 which prevents arcing of switch SW1 contacts when switch SW1 is opened.

The 24 VDC appearing at the terminal $V_{BAT}$ switched is supplied to a voltage regulator 36 which provides at its output +12 VDC. The output of voltage regulator 36 is connected to the voltage regulator 38. Voltage regulator 38 provides at its output +5 VDC which is supplied to the logic elements of injector apparatus 20 including the $V_{DD}$ of a microcontroller 40.

Microcontroller 40 monitors the battery voltage of batteries 22 and 24 a voltage divider circuit consisting of resistors R16 and R17 which are respectively 100 k-ohm and 10 k-ohm resistors. If the battery voltage provided to the PE0 input of microcontroller 40 is below approximately 20 volts, the PC 0 output of microcontroller 40 is set high or the logic one state. This logic one signal is supplied to an inverter 64 which inverts the signal resulting in a logic zero at the output of inverter 64. There is a also a current limiting resistor R8 connected to the output of inverter 64. A low at the output of inverter 64 turns on a light emitting diode 44 which indicates a low battery voltage.

Figure 4:
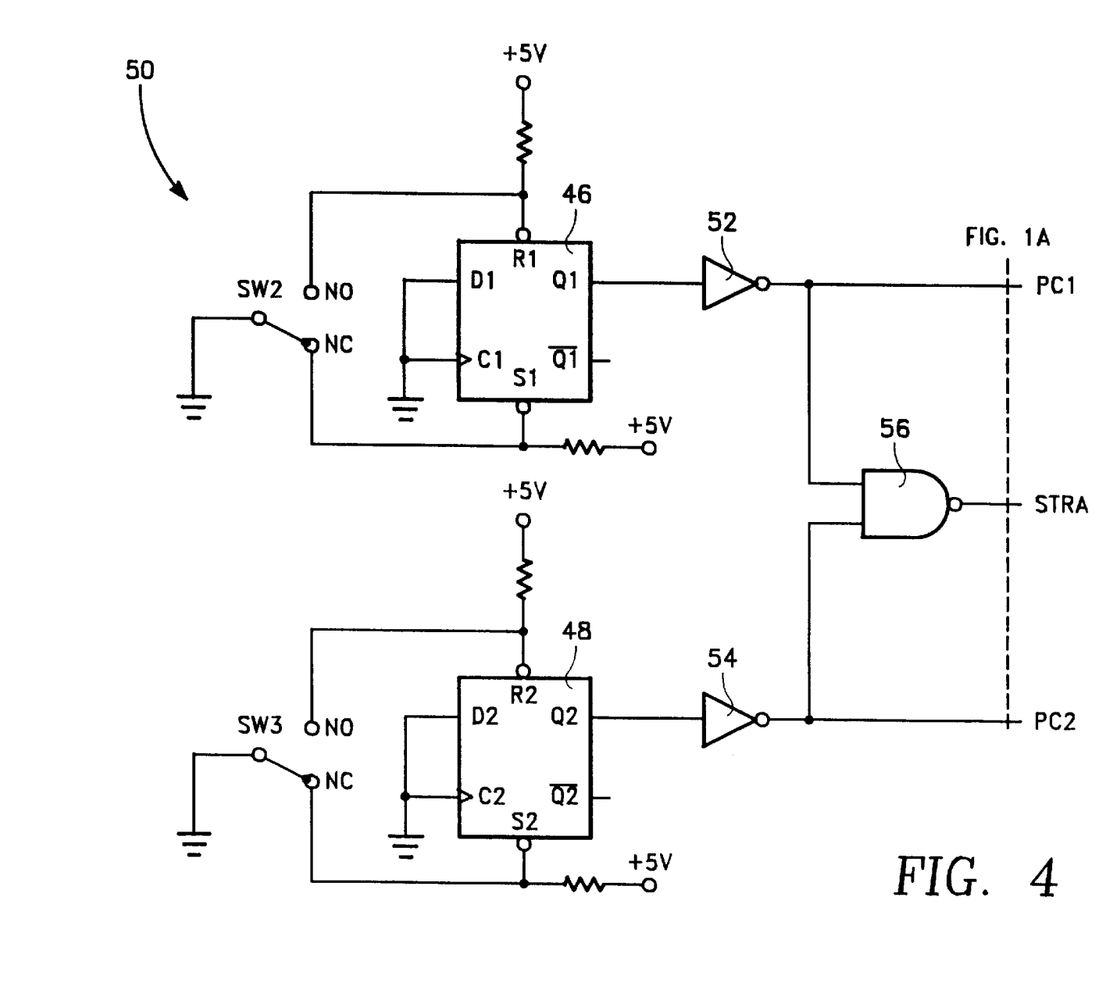

Referring to FIG. 4, power control switches SW2 and SW3, which along with D Flip-Flops 46 and 48 comprise a debounce circuit 50 for power up and power down operator control by the operator. Power control switches SW2 and SW3 are momentary contact switches. The Q1 output of Flip-Flop 46 transitions from a high state to a low state to a high state every time a user closes switch SW2, thus providing a pulse at the Q1 output of Flip-Flop 46 every time switch SW2. Similarly, the Q2 output of Flip-Flop 48 transitions from a high state to a low state to a high state every time a user closes switch SW3, thus providing a pulse at the Q2 output of Flip-Flop 48 every time switch SW3.

The high to low pulse provided at the Q1 output of Flip-Flop 46 is supplied to an inverter 52 which inverts the pulse and then supplies the inverted pulse to a NAND gate 56. The high to low pulse provided at the Q2 output of Flip-Flop 48 is supplied to an inverter 54 which inverts the pulse and then supplies the inverted pulse to NAND gate 56.

The resulting pulse occurring at the output of NAND gate 56 is a high to low pulse which occurs if either switch SW2 or SW3 is pressed.

Figure 1A:
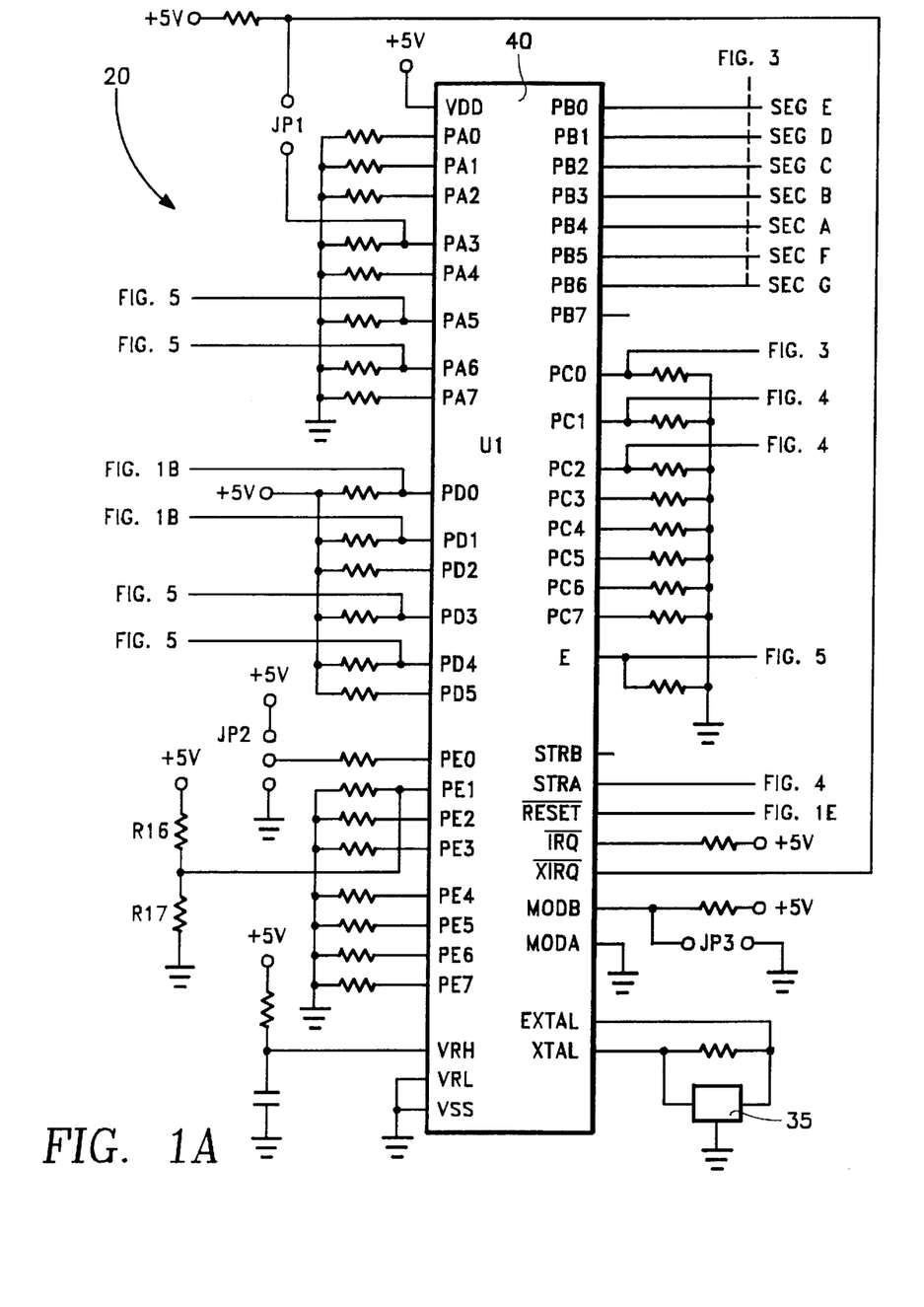
FIGS. 1A–1F, 2, 3, 4, and 5 are a detailed electrical schematic diagram of the pulse width modulated cable signal injecting apparatus which constitutes the preferred embodiment of the present invention.
Figure 1B:
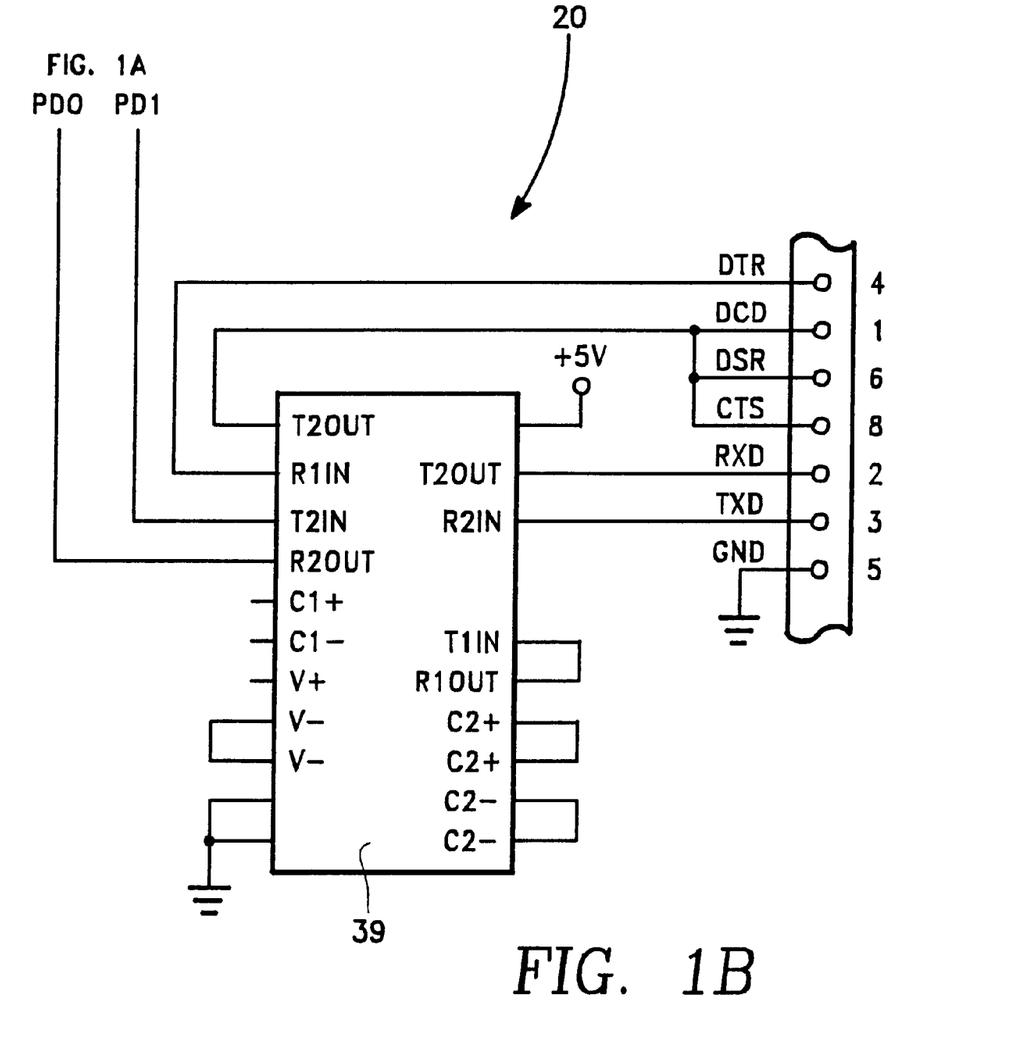
Figure 1C:
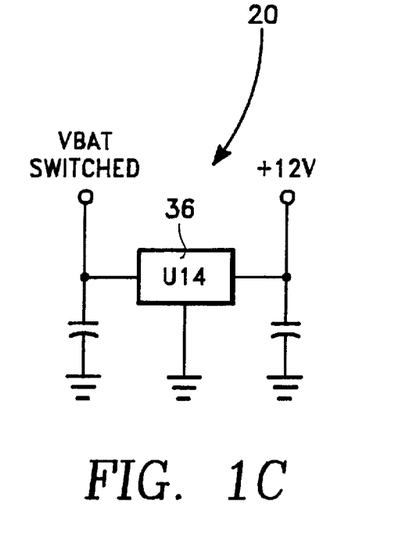
Figure 1D:
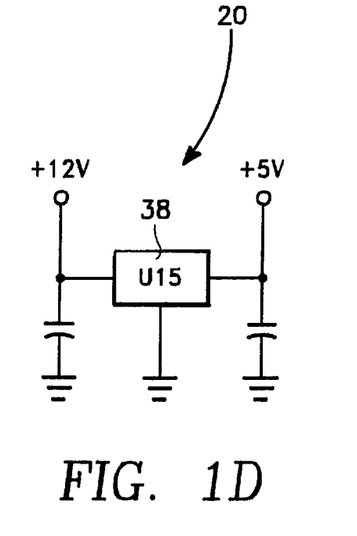
Figure 1E:
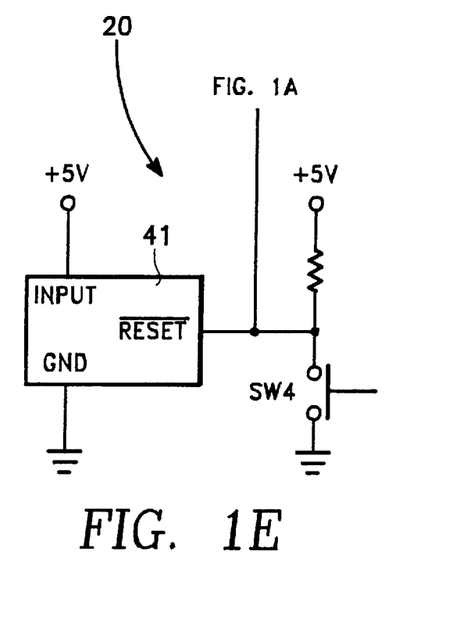
Figure 1F:
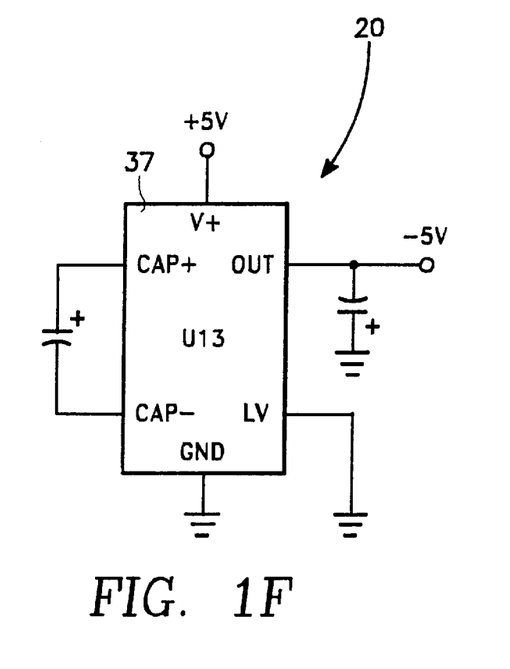
Figure 2:
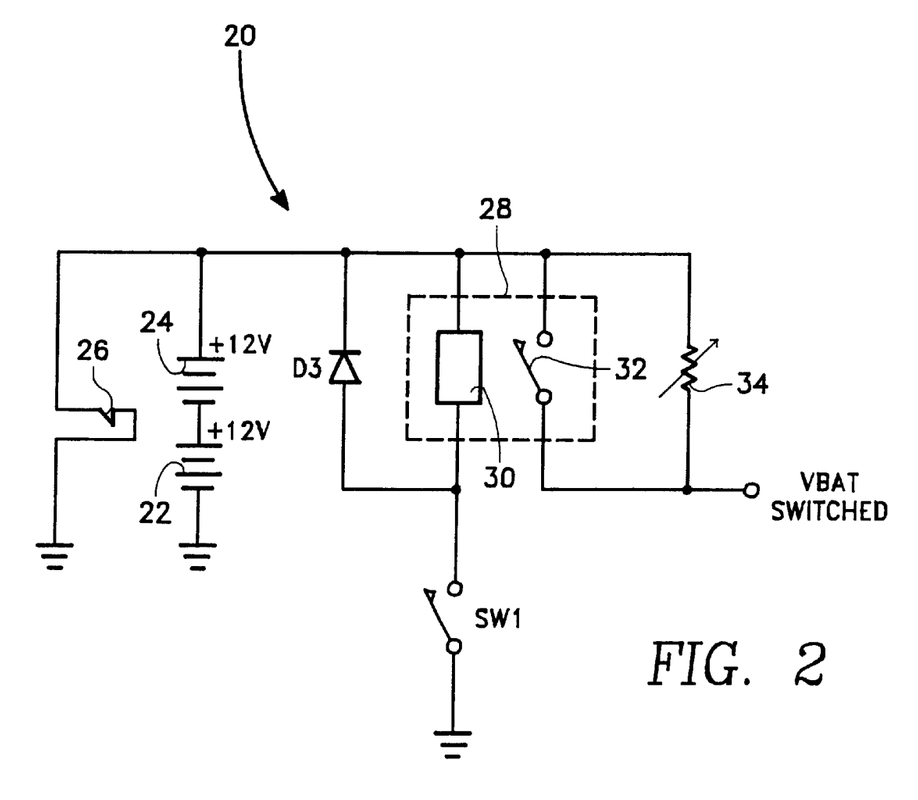

Referring to FIGS. 1A and 4, the three pulse signals identified as PC1, STRA and PC2 are supplied to the PC1, PC2 and the STRA inputs of microcontroller 40. Microcontroller 40 reads and then processes the PC1, PC2 and STRA pulse signals to determine which switch SW2 or SW3 is being pressed and then adjust the power level of the 1024 Hz signal provided injecting apparatus 20 accordingly. Switch SW2 is the power up switch and SW3 is the power down switch, thus, PC1 is the power up pulse signal and PC2 is the power down pulse signal.

Figure 3:
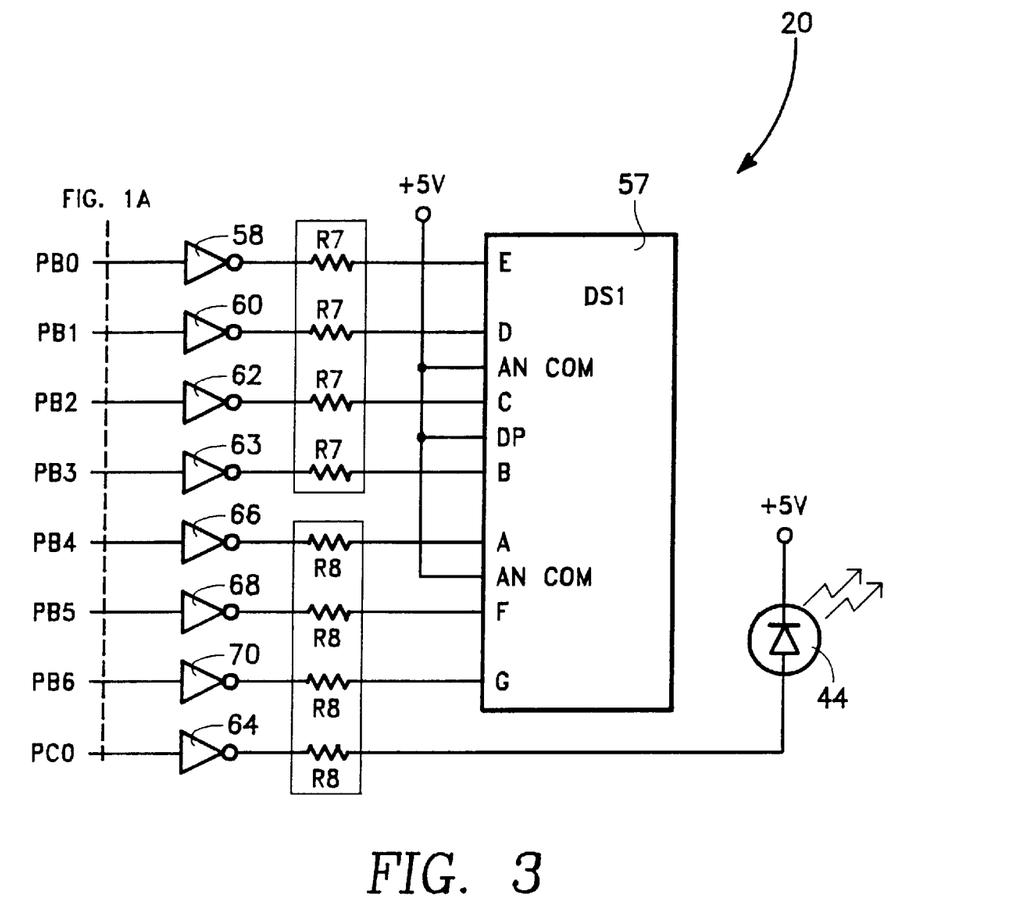

Referring to FIG. 3, injecting apparatus 20 also has a seven segment light emitting diode (LED) display 57 which has its inputs connected through inverters 58, 60, 62, 64, 66, 68 and 70 to the PB0–PB6 outputs of microcontroller 40. Inverters 58, 60, 62, 64, 66, 68 and 70 buffer and invert the signals from microcontroller 40 to LED display 57, while resistors R7 and R8 limit the current to the individual segments of LED display 57.

Figure 5:
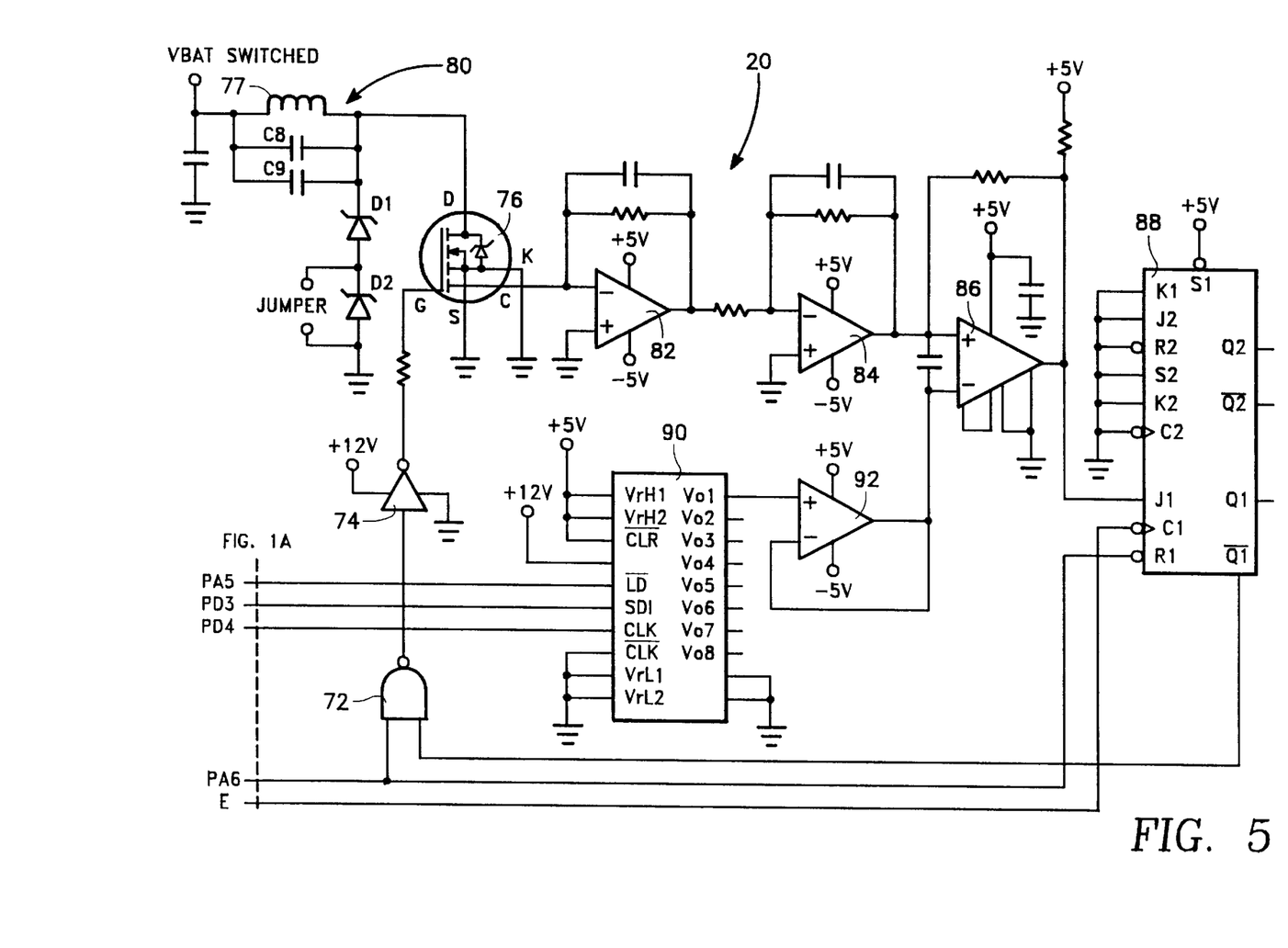

Referring to FIGS. 1A and 5, microcontroller 40 generates a continuous 1024 hertz square wave signal at its PA6 output which is supplied to the first input of a NAND gate 72. This signal passes through and is inverted by NAND gate 72 when NAND gate 72 receives a logic one enable signal at its second input of NAND gate 72. Inverter 74 inverts the 1024 hertz square wave signal and then supplies the signal to the gate of a MOSFET (Metal-Oxide-Semiconductor Field Effect Transistor) 76. Inverter 74 is a MOSFET driver.

A signal injector coil 77 is attached to a water tight electronics canister (not illustrated) through an external connector. The water tight canister contains the batteries and electronics for injecting apparatus 20

The primary of signal injector coil 77, capacitor C8 and capacitor C11 comprise a tank circuit 80. Capacitor C8 is a 10 uF capacitor, while capacitor C11 is a 0.22 uF capacitor. When MOSFET 76 is switched on tank circuit 80 starts oscillating and will continue to oscillate when MOSFET 76 is switch off. Tank circuit 80 oscillations increase the power coupled to the secondary cable (not shown).

A pair of zener diodes D1 and D2 are used to prevent the drain voltage of MOSFET 76 from exceeding approximately 100 volts which could damage MOSFET 76. Small energy transients which are faster than the diodes D1 and D2 will generally exceed 100 volts, but do not provide sufficient energy to damage MOSFET 76. A jumper wire applied around diode D2 may be used to bypass diode D2 leaving only diode D1 operational. This, in turn, allows for different diode combinations for different breakdown voltages and current requirements for MOSFET 76. The tank circuit 80 oscillations do not normally exceed 80 volts peak. Accordingly, a 91 volt zener diode will protect MOSFET 76 from high voltage spikes, but not breakdown from tank circuit 76 oscillations during normal operation of injecting apparatus 20.

MOSFET 76 is a current sensing device which provides an accurate fraction of the drain current through its current sense lead C and its Kelvin sense lead K. A current of approximately 1/3000 of $I_D$ is supplied from the current sense lead c of MOSFET 76 to the negative input of an operational amplifier 82. Operational amplifier 82 converts this current to a negative voltage signal and also acts as a low pass filter removing transients caused when MOSFET 76 turns on. The negative voltage signal from operational amplifier 82 is supplied to an operational amplifier 84. This signal is inverted to a positive going waveform/signal and filtered by amplifier 84 which is operating as a low pass filter.

The positive going voltage, which represents the drain current to MOSFET 76, is supplied to the positive input of voltage comparator 86. A power level control signal is supplied to the negative input of voltage comparator 86.

Microcontroller 40 generates the power level control to signal based on the operator inputs from depressing switches SW2 and SW3, which are the power up/down push button switches. Microcontroller 40 outputs a digital word to a digital-to-analog converter 90 that represents the power level. The analog output signal provided by converter 90 is buffered by operational amplifier 92 and then supplied to the negative input of voltage comparator 86. A J-K Flip-Flop 88 completes the control loop with the E clock signal for Flip-Flop 88 being provided by microcontroller 40.

When the 1024 Hz square wave signal from microcontroller 40 is low, it resets Flip-Flop 88 which causes the Q1 output of Flip-Flop 88 to transition high enabling NAND gate 72. Enabling NAND gate 72 allows the 1024 Hz square wave signal to pass through NAND gate 72, inverter 74 and turn on MOSFET. The coil current starts to rise when the 1024 Hz square wave is at the positive part of its cycle, the time constant depending on the secondary load. A lower secondary impedance will result in more secondary current with the resultant being a greater cancellation of primary flux and consequently a faster rise time. The current will rise to the point at which the voltage at the positive input of comparator 86 reaches the threshold voltage at negative input of comparator 86. When this occurs, the output of comparator 86 will switch from a low to a high.

On the next falling edge of the E clock signal from microcontroller 40, the $\overline{Q}$ output of Flip-Flop 88 will transition low. A low output at the $\overline{Q}$ output of Flip-Flop 88 will disable NAND gate 72 and turn off MOSFET 76 which turns off the coil current.

The microcontroller digital word supplied to the digital-to-analog converter 90 sets the maximum primary current for signal injector coil 77 to about 12 amperes at the maximum power level set by the operator through switches SW2 and SW3. With a 50 ohm secondary load, the primary current reaches 12 amperes in approximately 20 msecs which is approximately one half of the period of the 1024 HZ signal. Using a nominal 50 ohm load, the primary current reaches a maximum level at the end of the positive pulse of the 1024 Hz signal and comparator 86 does not trip and disable NAND gate 72. Using a lower impedance secondary load, the primary current will reach the maximum current before 20 msec and the current will be shut off before damage to MOSFET 76 occurs.

Injecting apparatus 20 includes a switched capacitor voltage converter 37 which inverts the 5 VDC supplied to its V+ input to a corresponding negative voltage of –5 VDC for the operational amplifiers 82, 84 and 92 shown in FIG. 5. Injector apparatus 20 also includes a computer interface 39 (FIG. 1B) which allows an operator to interface microcontroller 40 to an external computer. A supply voltage supervisor 41 (FIG. 1E) is connected to the /RESET input of microcontroller 40. Supply voltage supervisor 41 monitors the supply voltage for under voltage conditions. During power up, when the supply voltage attains a value approaching 1 volt, the /RESET output of supply voltage supervisor becomes active low to prevent undefined operation.

The signal injector coil 77 consists of a split-core 3transformer with four turns of #20 transformer wire distributed evenly across half of the core. Power is transmitted to the injector coil via an electrical cable which connects to the amplifier canister (J2). The percentage of available power applied to the coil is controlled by the "Power Up"/"Power Down" push button switches SW2 and SW3 located on a amplifier front panel.

Each half of the injector core is molded into a mating cylindrical PVC housing using a polyether polyurethane as a bonding matrix. The secondary transformer winding is spliced to a 12-foot cable, and the transformer and splice are encapsulated in the urethane matrix. The cable exits the housing through a strain relief and terminates to a two-pin male wet mateable underwater connector.

The two halves of the signal injector coil 77 are hinged together with stainless steel fasteners. After placement of the coil around the cable, the two core faces are drawn tightly together and locked into place using four stainless steel latches.

The transformer core material is a silicon steel alloy. The exposed faces are very susceptible to rust and corrosion. After use, corrosion is minimized by flushing the faces with fresh water and by keeping the core surfaces covered with a thin coat of silicon compound.

Appendix A is a program listing of the computer software program for microcontroller 40.

From the foregoing, it may readily be seen that the present invention comprises a new, unique and exceedingly cable signal injecting apparatus for use in locating an undersea cable which constitutes a considerable improvement over the known prior art. Many modifications and variations of the present invention are possible in light of the above teachings. It is to be understood that within the scope of the appended claims the invention may be practiced otherwise than as specifically described.

APPENDIX A

```
*************************************************************************
*       PROGRAM FOR DIGITAL INJECTOR CIRCUIT                  *
*       1024HZ ON PA6/OC2                                     *
*       SPI OUTPUT TO D/A CONVERTER                           *
*       LOAD LINE TO D/A ON PA5                               *
*       LOW BATTEY MONITOR READ USING A/D                     *
*       ON PE1, OUTPUT TO LED ON PC0                          *
*       OUTPUT TO SEVEN SEGMENT DISPLAY                       *
*       TO INDICATE POWER LEVEL ON PORTB                      *
*       TWO SWITCHES FOR UP/DOWN POWER                        *
*       CNRL, INTO PC1 AND PC2 USING                          *
*       STRA INTERRUPT                                        *
*       WATCHDOD TIMER                                        *
*       PROGRAM IN EEPROM USING BUFFALO                       *
*       INTERRUPT VECTORS                                     *
*************************************************************************
****** EQUATES *****
RAM           EQU $0000
EEPROM        EQU $B600
PORTA         EQU $1000
PIOC          EQU $1002
PORTC         EQU $1003
PORTB         EQU $1004
PORTCL        EQU $1005
DDRC          EQU $1007
DDRD          EQU $1009
TOC2H         EQU $1018
TOC2L         EQU $1019
TCTL1         EQU $1020
TMSK1         EQU $1022
TFLG1         EQU $1023
SPCR          EQU $1028
SPSR          EQU $1029
SPDR          EQU $102A
ADCTL         EQU $1030
ADR2          EQU $1032
OPTION        EQU $1039
COPRST        EQU $103A
STACK         EQU $006F
DACMAX        EQU $A2              * BD into DAC = 3.2 volts out *
DACMIN        EOU $00
DACRANGE      EQU DACMAX-DACMIN    * DACRANGE MUST A MULTIPLE OF 9 *
DACDIV        EQU DACRANGE/9
DACSTEP       EQU DACDIV
_1024HZ       EQU $03D2
_995HZ        EQU $03ED
_25HZ         EQU $9C40
OC2_VEC       EQU $ooDC            * BUFFALO OC2 INTERRUPT VECTOR
                                     IN RAM *
STRA_VEC      EQU $ooEE            * BUFFALO IRQ/STRA INTERRUPT VECTOR
                                     IN RAM *
COP_VEC       EQU $00FA            * BUFFALO COP INTERRUPT VECTOR
                                     IN RAM *
```

-continued

APPENDIX A

```
LOW_BAT    EQU $5D                    * 0 = 0 V, FF = 5 V, 5D = 1.82 V = 20 V @ BAT
ZERO       EQU %00111111              * $3F
ONE        EQU %00001100              * $0C *
TWO        EQU %01011011              * $5B *
THREE      EQU %01011110              * $5E *
FOUR       EQU %01101100              * $6C *
FIVE       EQU %01110110              * $76 *
SIX        EQU %01110111              * $77 *
SEVEN      EQU %00011100              * $1C *
EIGHT      EQU %01111111              * $7F *
NINE       EQU %01111110              * $7E *
***** RAM VARIABLES *****
           ORG RAM                    * START OF RAM *
DAC        RMB 1
***** EEPROM LOOKUP TABLES *****
           ORG $B7Fo
LEDTABLE FCB $3F,$OC,$5B,$5E,$6C,$76,$77,$1C,$7F,$7E
***** INITIALIZATION ***************************************
           ORG EEPROM                 * START OF EEPROM *
START      LDAA #$90
           STAA OPTION                * A/D ON, IRQ LEVEL SEN, DLY
                                        ON, NO CME *
******* LOAD INTERRUPT VECTOR JUMP TABLE IN RAM *****
           LDAA #$7E                  * JMP INSTRUCTION *
           STAA OC2_VEC
           LDD #ISROC2                * ISR FOR OC2 *
           STD OC2 VEC+1
           LDAA #$7E                  * JMP INSTRUCTION *
           STAA STRA VEC
           LDD #ISRSTRA               * ISR FOR STRA *
           STD STRA VEC+1
           LDAA #$7E                  * JMP INSTRUCTION *
           STAA COP_VEC
           LDD #START                 * RESTART PROGRAM IF
                                        WATCHDOG TIMES OUT *
           STD COP VEC+1
           LDAA #DACMIN
           STAA DAC                   * INITIALIZE DAC TO DACMIN *
           LDS #STACK                 * SETUP STACK *
           LDD #_1024HZ
           STD TOC2H                  * SETUP FOR 1024 HZ *
           LDAA #$40
           STAA TCTL.1                * OUTPUT COMPARE TOGGLE
                                        MODE FOR OC2 *
           STAA TMSK1                 * ENABLE OC2 INTERRUPT MASK
                                        FLAG *
           LDAA #$42
           STAA PIOC                  * INT EN, SIMPLE HANDSHAKE,
                                        STRA RISING EDGE *
           LDAA #$19
           STAA DDRD                  * SS IN, SCK OUT, MOSI OUT,
                                        MISO IN *
           LDAA #$73
           STAA SPCR                  * ENABLE SPI, DWOM, MASTER,
                                        CPOL=0, CPHA=0, E/32 *
           LDAA #$20
           STAA PORTA                 * PA5 HIGH, USED FOR LOAD
                                        LINE TO DAC *
           LDAA #$01
           STAA DDRC                  * PC0 OUTPUT:  PC1,2,3,4,5,6,7
                                        INPUT *
CLI                                   * CLEAR INTERRUPT FLAG *
******************** MAIN ****************************************
RUN        JSR RESET_COP              * RESET WATCHDOG TIMER *
           JSR OUT_DAC                * OUTPUT DATA TO DAc TO SET
                                        POWER LEVEL *
           JSR OUT_LED                * SET 7 SEG DISPLAY TO
                                        INDICATE POWER LEVEL *
           JSR A_D                    * READ A_D TO CHECK FOR
                                        LOW BATTERY VOLTAGE *
           JMP RUN
*******************************************************************
```

-continued

APPENDIX A

```
RESET_COP   LDAA #$55                       * ARM COP TIMER-
                                              CLEARING MECHANISM.*
            STAA COPRST
            LDAA #$AA * CLEAR COP TIMER *
            STAA COPRST
            RTS
*************************************************************************
A_D         LDAA #$01
            STAA ADCTL                      * START A/D CONVERSION ON
                                              CHANNEL 1 *
WAIT        LDAA ADCTL                      * READ A/D CONTROL/STATUS
                                              REGISTER *
            CLC
            LSLA                            * CHECK CONVERSION
                                              COMPLETE FLAG *
            BCC WAIT                        * WAIT IF NOT COMPLETE *
            LDAA ADR2
            CMPA #LOW BAT
            BLS LOW_VOLT                    * FOR UNSIGNED NUMBERS *
            LDAA #$00
            STAA PORTC                      * TURN OFF LOW BATTERY LED *
            RTS
LOW_VOLT    LDAA #01
            STAA PORTC                      * TURN ON LOW BATTERY LED *
            RTS
*************************************************************************
OUT_LED     LDAA #$00
            LDAB DAC                        * NUMBER BEING OUTPUT TO
                                              DAC, LDD -AC *
            LDX DACDIV                      * DIVISOR *
            IDIV                            * ACCD/Ix, OU0TIENT IN IX *
            XODX                            * LOAD D WITH IX *
            ADDD LEDTABLE                   * LEDTABLE + X *
            XGDX                            * LOAD IX WITH D *
            LDAA 0,X                        * GET C0RRECT NUMBER
                                              IN TABLE *
            STAA PORTB
            RTS
*************************************************************************
OUT DAC     LDAA #$00                       * ADDRESS IN DAC FOR DAC A *
            STAA SPDR
            JSR POLL_SPIF                   * WAIT UNTILL ADDRESS IS
                                              LOADED INTO DAC *
            LDAA DAC                        * GET DATA FOR DAC *
            STAA SPDR
            JSR POLL SPIF                   * WAIT UNTILL DATA IS LOADED
                                              INTO DAC *
            JSR LD_LOW                      * PULSE LOAD LINE TO DAC LOW
                                              TO LATCH DATA *
            RTS
*************************************************************************
POLL_SPIF   LDAA SPSR
            ANDA #$80
            CMPA #$80                       * IS SPIF SET ?, IS DATA
                                              TRANSFER COMPLETE ?*
            BNE POLL_SPIF                   * WAIT UNTILL DATA TRANSFER
                                              IS COMPLETE *
            RTS
*************************************************************************
LD_LOW      LDAA #$00                       * PULSE PA5 LOW *
            STAA PORTA
            LDAA #$20                       * PA5 HIGH *
            STM PORTA
            RTS
*************************************************************************
ISRSTRA     LDAA PIOC                       * CLEAR STAF (STROBE
                                              A INT FLAG) *
            LDAA PORTCL                     * GET POWER CONTROL SWITCH
                                              DATA *
            RORA
            RORA
            BCC POWER_UP
            RORA
            BCC POWER_DN
            JMP RETURN
```

-continued

APPENDIX A

```
POWER_UP   LDAA DAC
           CMPA #DACMAX
           BEQ RETURN
           ADDA #DACSTEP
           JMP OK
POWER_DN   LDAA DAC
           CMPA #DACMIN
           BEQ RETURN
           SUBA #DACSTEP
OK         STAA DAC
RETURN     RTI
*************************************************************
ISROC2     LDAA #$40
           STAA TFLG1             * CLEAR OC2 TIMER INTERRUPT
                                  FLAG *
           LDD TOC2H
           ADDD #_1024HZ
           STD TOC2H
           RTI
```

What is claimed is:

1. A signal injecting apparatus for use in locating an undersea cable comprising:

processing means for generating a square wave signal having a set frequency;

first and second switching means connected to said processing means, said first and second switching means providing power up/down signals when an operator depresses said first and second switching means;

said processing means, responsive to said power up/down signals, providing a digital word representative of a power level for a tracking signal which said signal injecting apparatus injects into said undersea cable;

gating means having a first input connected to said processing means for receiving said square wave signal, a second input and an output;

a field effect transistor having a gate connected to the output of an inverter driver, a current sense output, and a drain, said field effect transistor providing a current level signal representative of a drain current being supplied to the drain input of said field effect transistor;

converting means connected to said processing means for receiving said digital word and converting said digital word to an equivalent analog signal;

control loop circuit means having a first input connected to the current sense output of said field effect transistor to receive said current level signal, a second input connected to said converting means to receive said equivalent analog signal and an output connected the second input of said gating means; said control loop circuit means, responsive to said equivalent analog signal and said current level signal, providing an enable signal to said gating means to enable said gating means allowing said square wave signal to pass through said gating means to the gate of said field effect transistor turning said field effect transistor on and off at the set frequency of said square wave signal;

a signal injector coil connected to the drain of said field effect transistor in response to said square wave signal from said field effect transistor when said gating means is enabled; and said signal injector coil, responsive to said square wave signal, generating said tracking signal, said signal injector coil being coupled to said undersea cable to inject said tracking signal into said undersea cable.

2. The signal injecting apparatus of claim 1 wherein the set frequency of said square wave signal comprises a 1024 hertz signal.

3. The signal injecting apparatus of claim 1 further comprising first and second capacitors connected parallel to said signal injector coil, said first capacitor having a capacitance of 10 uF and said second capacitor having a capacitance of 0.22 uF.

4. The signal injecting apparatus of claim 1 wherein said control loop circuit means comprises:

a first amplifier having an input connected to the current sense output of said field effect transistor and an output;

a second amplifier having an input connected to the output of said first amplifier and an output;

a comparator having a positive input connected to the output of said second amplifier, a negative input and an output;

a Flip-Flop having a J input connected to the output of said comparator, a clock input connected to said processing means, a K input connected to ground and a not Q output connected to the second input of said gating means; and a third amplifier having an input connected to an output of said converting means and an output connected to the negative input of said comparator.

5. A signal injecting apparatus for use in locating an undersea cable comprising:

a microcontroller for generating a square wave signal having a set frequency;

first and second push button switches connected to said microcontroller, said first and second push button switches providing power up/down signals when an operator depresses said first and second push button switches;

said microcontroller, responsive to said power up/down signals, providing a digital word representative of a power level for a tracking signal which said signal injecting apparatus injects into said undersea cable;

a logic gate having a first input connected to said microcontroller for receiving said square wave signal, a second input and an output;

an inverter driver having an input connected to the output of said logic gate and an output;

a field effect transistor having a gate connected to the output of said inverter driver, a current sense output, and a drain, said field effect transistor providing a current level signal representative of a drain current being supplied to the drain input of said field effect transistor;

a digital-to-analog converter connected to said microcontroller to receive said digital word and convert said digital word to an equivalent analog signal;

a control loop circuit having a first input connected to the current sense output of said field effect transistor to receive said current level signal, a second input connected to said digital to analog converter to receive said equivalent analog signal and an output connected the second input of said logic gate;

said control loop circuit, responsive to said equivalent analog signal and said current level signal, providing an enable signal to said logic gate to enable said logic gate allowing said square wave signal to pass through said logic gate and said inverter to the gate of said field effect transistor turning said field effect transistor on and off at the set frequency of said square wave signal;

a signal injector coil connected to the drain of said field effect transistor to receive said square wave signal from said field effect transistor when said NAND gate is enabled; and said signal injector coil, responsive to said square wave signal, generating said tracking signal, said signal injector coil being coupled to said undersea cable to inject said tracking signal into said undersea cable.

6. The signal injecting apparatus of claim 5 wherein the set frequency of said square wave signal comprises a 1024 hertz signal.

7. The signal injecting apparatus of claim 5 further comprising first and second capacitors connected to parallel said signal injector coil, said first capacitor having a capacitance of 10 uF and said second capacitor having a capacitance of 0.22 uF.

8. The signal injecting apparatus of claim 5 wherein said control loop circuit comprises:
    a first amplifier having an input connected to the current sense output of said field effect transistor and an output;
    a second amplifier having an input connected to the output of said first amplifier and an output;
    a comparator having a positive input connected to the output of said second amplifier, a negative input and an output;
    a Flip-Flop having a J input connected to the output of said comparator, a clock input connected to said microcontroller, a K input connected to ground and a not Q output connected to the second input of said logic gate; and
    a third amplifier having an input connected to an output of said digital to analog converter and an output connected to the negative input of said comparator.

9. The signal injecting apparatus of claim 5 further comprising a debounce circuit, said debounce circuit including:
    a first D-type Flip-Flop having a reset input connected to a first terminal of said first push button switch, a reset input connected to a second terminal of said first push button switch and a Q output;
    a second D-type Flip-Flop having a reset input connected to a first terminal of said second push button switch, a reset input connected to a second terminal of said second push button switch and a Q output;
    a first inverter having an input connected to the Q output of said first D-type Flip-Flop and an output connected to said microcontroller;
    a second inverter having an input connected to the Q output of said second D-type Flip-Flop and an output connected to said microcontroller; and
    a NAND gate having a first input connected to the output of said first inverter, a second input connected to the output of said second inverter and an output connected to said microcontroller.

10. The signal injecting apparatus of claim 5 further comprising a light emitting diode display connected to said microcontroller.

11. The signal injecting apparatus of claim 5 further comprising a computer interface connected to said microcontroller for allowing said operator to interface said microcontroller to an external computer.

12. The signal injecting apparatus of claim 5 further comprising:
    a battery having an output;
    a diode having a cathode connected to the output of said battery and an anode
    a normally open switch having a first terminal connected to ground and a second terminal connected to the anode of said diode;
    a relay having a coil and a normally open contact, the coil of said relay having an input connected to the output of said battery and an output connected to the second terminal of said normally open switch, the normally open contact of said relay having a first terminal connected to the output of said battery and a second terminal;
    a varister having an input connected to the output of said battery and an output connected to the second terminal of the normally open contact of said relay;
    a first voltage regulator having an input connected to the second terminal of the normally open contact of said relay and an output; and
    a second voltage regulator having an input connected to the output of said first voltage regulator and an output connected to said microcontroller.

13. The signal injecting apparatus of claim 12 wherein said battery comprises a pair of rechargable twelve volt batteries.

14. The signal injecting apparatus of claim 12 wherein said first voltage regulator comprises a 24 VDC to 12 VDC regulator and said second voltage regulator comprises a 12 VDC to 5 VDC regulator.

15. A signal injecting apparatus for use in locating an undersea cable comprising:
    a microcontroller for generating a square wave signal having a set frequency of approximately 1024 hertz;
    first and second push button switches connected to said microcontroller, said first and second push button switches providing power up/down signals when an operator depresses said first and second push button switches;
    said microcontroller, responsive to said power up/down signals, providing a digital word representative of a power level for a tracking signal which said signal injecting apparatus injects into said undersea cable;
    a NAND gate having a first input connected to said microcontroller for receiving said square wave signal, a second input and an output;
    an inverter driver having an input connected to the output of said NAND gate and an output;
    a field effect transistor having a gate connected to the output of said inverter driver, a current sense output, and a drain, said field effect transistor providing a current level signal representative of a drain current being supplied to the drain input of said field effect transistor;

a digital-to-analog converter connected to said microcontroller to receive said digital word and convert said digital word to an equivalent analog signal;

a control loop circuit having a first input connected to the current sense output of said field effect transistor to receive said current level signal, a second input connected to said digital to analog converter to receive said equivalent analog signal and an output connected the second input of said NAND gate;

said control loop circuit, responsive to said equivalent analog signal and said current level signal, providing an enable signal to said NAND gate to enable said NAND gate allowing said square wave signal to pass through said NAND gate and said inverter to the gate of said field effect transistor turning said field effect transistor on and off at the set frequency of said square wave signal;

a signal injector coil connected to the drain of said field effect transistor to receive said square wave signal from said field effect transistor when said NAND gate is enabled;

said signal injector coil, responsive to said square wave signal, generating said tracking signal, said signal injector coil being coupled to said undersea cable to inject said tracking signal into said undersea cable;

first and second capacitors connected parallel to said signal injector coil; and said control loop circuit including:
  a first amplifier having an input connected to the current sense output of said field effect transistor and an output;
  a second amplifier having an input connected to the output of said first amplifier and an output;
  a comparator having a positive input connected to the output of said second amplifier, a negative input and an output;
  a Flip-Flop having a J input connected to the output of said comparator, a clock input connected to said microcontroller, a K input connected to ground and a not Q output connected to the second input of said NAND gate; and
  a third amplifier having an input connected to an output of said digital to analog converter and an output connected to the negative input of said comparator.

16. The signal injecting apparatus of claim 15 wherein said first capacitor has a capacitance of 10 uF and said second capacitor has a capacitance of 0.22 uF.

17. The signal injecting apparatus of claim 15 further comprising a light emitting diode display connected to said microcontroller.

18. The signal injecting apparatus of claim 15 further comprising:
  a battery having an output;
  a diode having a cathode connected to the output of said battery and an anode
  a normally open switch having a first terminal connected to ground and a second terminal connected to the anode of said diode;
  a relay having a coil and a normally open contact, the coil of said relay having an input connected to the output of said battery and an output connected to the second terminal of said normally open switch, the normally open contact of said relay having a first terminal connected to the output of said battery and a second terminal;
  a varister having an input connected to the output of said battery and an output connected to the second terminal of the normally open contact of said relay;
  a first voltage regulator having an input connected to the second terminal of the normally open contact of said relay and an output; and
  a second voltage regulator having an input connected to the output of said first voltage regulator and an output connected to said microcontroller.

19. The signal injecting apparatus of claim 18 wherein said battery comprises a pair of rechargable twelve volt batteries.

20. The signal injecting apparatus of claim 18 wherein said first voltage regulator comprises a 24 VDC to 12 VDC regulator and said second voltage regulator comprises a 12 VDC to 5 VDC regulator.

* * * * *